United States Patent
Scranton

(10) Patent No.: US 7,680,493 B2
(45) Date of Patent: Mar. 16, 2010

(54) LOW PHASE NOISE TESTING SYSTEM UTILIZING A CRYSTAL FILTER

(75) Inventor: Timothy F. Scranton, Rancho Santa Margarita, CA (US)

(73) Assignee: Broadcom Corporation, Irvine, CA (US)

(*) Notice: Subject to any disclaimer, the term of this patent is extended or adjusted under 35 U.S.C. 154(b) by 491 days.

(21) Appl. No.: 11/801,816

(22) Filed: May 10, 2007

(65) Prior Publication Data

US 2008/0278263 A1 Nov. 13, 2008

(51) Int. Cl.
*H04W 24/00* (2006.01)

(52) U.S. Cl. ............... 455/425; 455/423; 455/67.11; 455/67.13; 455/67.14; 455/67.15; 702/117; 702/118; 702/124; 702/125; 702/126; 324/763; 324/764; 324/765; 714/738; 714/742; 714/744; 375/224

(58) Field of Classification Search ......... 455/423–425, 455/67.11–67.16, 67.7, 115.1–115.4, 226.1–226.4; 702/108, 117, 118, 120–121, 124–126; 375/224–228; 714/734, 738–744; 324/763, 764, 765
See application file for complete search history.

(56) References Cited

U.S. PATENT DOCUMENTS

| | | | | |
|---|---|---|---|---|
| 6,564,350 | B1 * | 5/2003 | Hoeweler et al. | 714/742 |
| 6,747,469 | B2 * | 6/2004 | Rutten | 324/765 |
| 7,246,025 | B2 * | 7/2007 | Heaton et al. | 702/117 |
| 7,340,219 | B2 * | 3/2008 | Heaton et al. | 455/67.11 |
| 7,463,676 | B2 * | 12/2008 | Chen | 375/222 |
| 7,567,883 | B2 * | 7/2009 | Heaton et al. | 702/118 |

* cited by examiner

Primary Examiner—Tuan A Tran
(74) Attorney, Agent, or Firm—Farjami & Farjami LLP

(57) ABSTRACT

According to one embodiment, a low phase noise testing system includes a tester providing a high phase noise digital channel output. The low phase noise testing system further includes a crystal filter configured to receive the digital channel output and to pass a narrow frequency range from the digital channel output, whereby the high phase noise digital channel output is converted to a low phase noise clock for use by a device under test. The crystal filter can be, for example, a monolithic crystal filter or a discrete crystal filter.

18 Claims, 4 Drawing Sheets

LOW PHASE NOISE TESTING SYSTEM UTILIZING A CRYSTAL FILTER

BACKGROUND OF THE INVENTION

1. Field of the Invention

The present invention is generally in the field of electronics. More particularly, the present invention is in the field of electronic device testing.

2. Background

Manufacturers of electronic devices generally rely on high volume testers, e.g. automated test equipment ("ATE"), to quickly and accurately test their electronic devices during production. Accordingly, the testers are configured to drive the electronic devices by generating and inputting various signals, e.g., a reference clock, into the electronic devices to test and evaluate their functionality. As such, it is important for the signals generated by the testers to have similar characteristics as the actual signals generated by the electronic devices during normal operation. For example, it is important for clock signals provided by a tester to have a phase noise as low as clock signals generated with the aid of a "crystal oscillator" employed during normal operation of an electronic device.

In particular, when testing an electronic device, such as a wireless local area network ("WLAN") transceiver, it is critical for a tester to generate a reference clock having a phase noise that is as low as the phase noise of the clock used by the electronic device during normal operation. Since a conventional testing system typically uses a conventional reference clock generator (e.g. a dedicated reference signal generator or a stand-alone function generator), the reference clock from the conventional testing system typically has a much higher phase noise than the phase noise of the clock generated by the electronic device during normal operation. Consequently, various electronic devices, such as WLAN transceivers, cannot be accurately tested using conventional testing systems.

SUMMARY OF THE INVENTION

A low phase noise testing system utilizing a crystal filter, substantially as shown in and/or described in connection with at least one of the figures, as set forth more completely in the claims.

DETAILED DESCRIPTION OF THE INVENTION

The present invention is directed to a low phase noise testing system utilizing a crystal filter. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
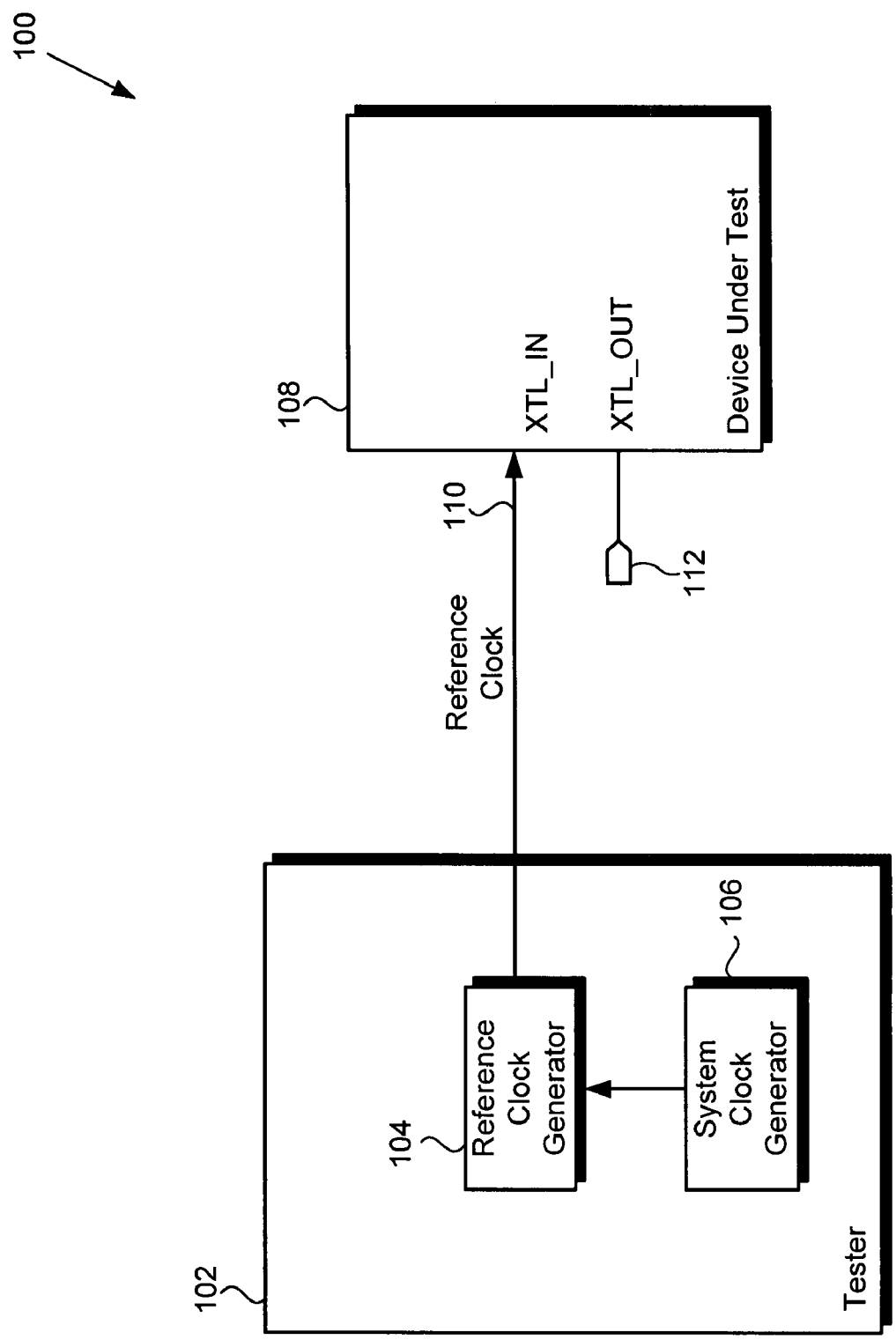
FIG. 1 shows a block diagram of a conventional testing system.

FIG. 1 shows a block diagram of conventional testing system 100. System 100 includes conventional tester 102 and device under test 108. As shown in FIG. 1, tester 102 includes system clock generator 106 and reference clock generator 104. System clock generator 106 can include an ovenized crystal oscillator configured to generate a highly stable system clock for use by tester 102. The system clock can also be referenced by various other instruments that might be included in tester 102, such as reference clock generator 104. As also shown in FIG. 1, reference clock generator 104 is configured to generate reference clock 110 using the system clock provided by system clock generator 106. Reference clock generator 104 can be, for example, a dedicated reference signal generator or a stand-alone function generator situated in tester 102 and reference clock 110 can be, for example, a time varying signal, such as a square wave or a sinusoidal wave.

Device under test 108 shown in FIG. 1 can be, for example, an electronic device such as a wireless local area network ("WLAN") transceiver or a Worldwide Interoperability for Microwave Access ("WiMAX") transceiver. In the embodiment shown in FIG. 1, reference clock 110 is input to the crystal oscillator input ("XTL_IN") of device under test 108, while crystal oscillator output ("XTL_OUT") 112 is left floating. It should be noted that tester 102 might be coupled to device under test 108 with a number of buses and probes during actual testing of device under test 108, which are not shown in FIG. 1 for ease of illustration.

By way of background, proper testing of electronic devices operating at high frequencies, such as WLAN and WiMAX transceivers, generally involves an accurate measurement of the phase noise of the electronic devices. These electronic devices typically utilize a crystal oscillator during normal operation to generate a clock having very low phase noise. However, such a crystal oscillator cannot be used in device under test 108 during testing because, for example, tester 102 requires coherency between the system clock of tester 102 and the reference clock of device under test 108. Since reference clock 110 generated by reference clock generator 104 has a substantially higher phase noise than the phase noise of a reference clock generated by a crystal oscillator, tester 102 cannot accurately test the phase noise of device under test 108.

Figure 2:
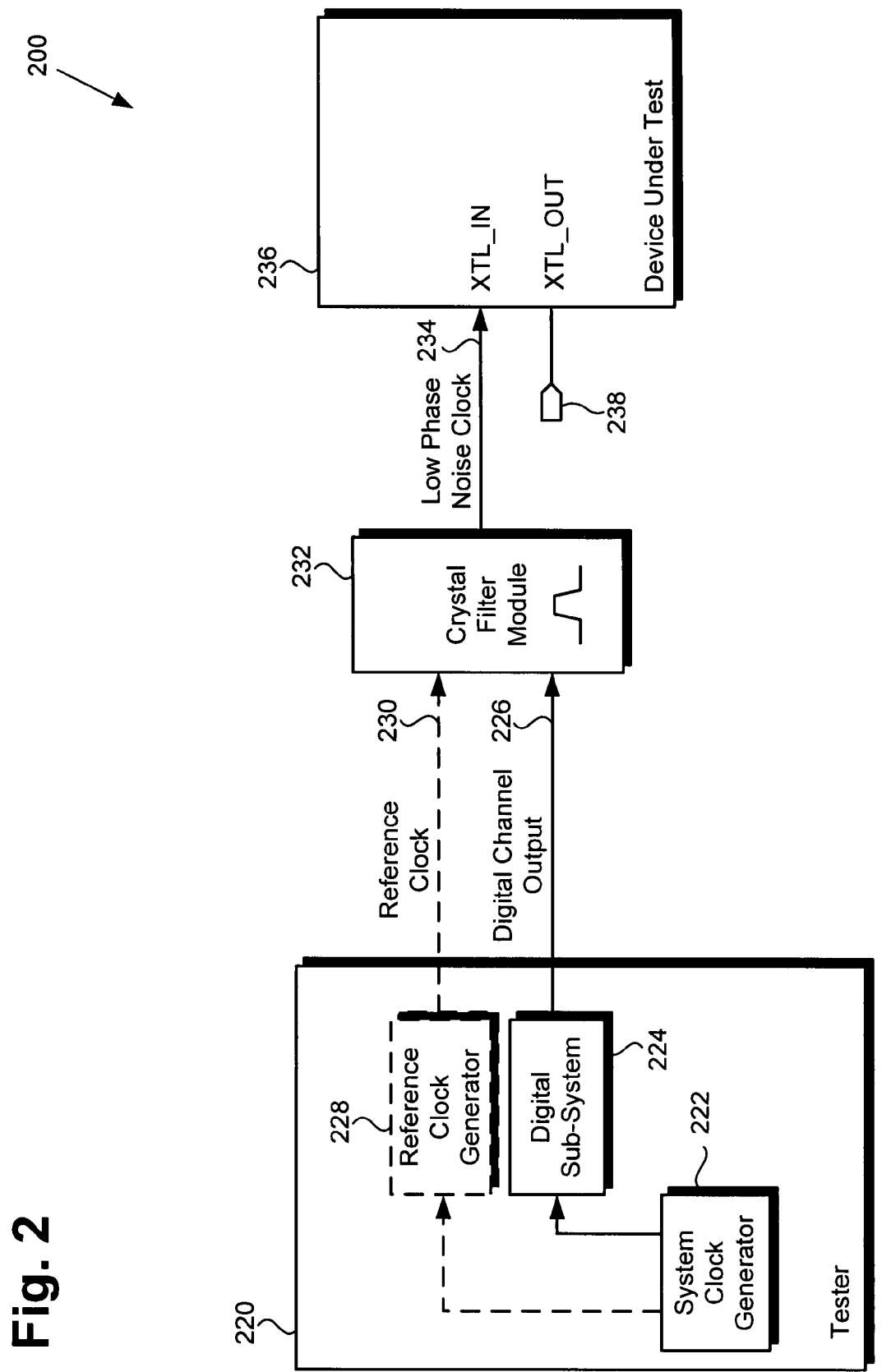
FIG. 2 shows a block diagram of a low phase noise testing system in accordance with one embodiment of the invention.

FIG. 2 shows a block diagram of low phase noise testing system 200 in accordance with one embodiment of the invention. System 200 includes tester 220, crystal filter module 232, and device under test 236. As shown in FIG. 2, tester 220 includes system clock generator 222, optional reference clock generator 228, and digital sub-system 224. In one embodiment, system clock generator 222 can include an ovenized crystal oscillator configured to generate a highly stable system clock for use by tester 220. By way of example, the system clock can be a square wave or a sinusoidal wave having a frequency of approximately 10.0 megahertz ("MHz"). The system clock can also be referenced by various other instruments that might be included in tester 220, such as digital sub-system 224 and optional reference clock generator 228 discussed below.

In one embodiment, digital sub-system 224 can be a subsystem in tester 220 having at least one digital channel configured to provide a digital channel output, such as digital channel output 226, using the system clock provided by system clock generator 222. Digital channel output 226 can be, for example, a time varying digital signal, such as a square wave. By way of example, the frequency of digital channel output 226 can be, for example, approximately 20.0 MHz. Digital channel output 226 typically has a phase noise that, although might be generally considered low, is referred to as a "high phase noise" for the purpose of the present application and to distinguish such phase noise from the much lower phase noise provided by low phase noise clock 234 according to the present invention, making it (i.e. low phase noise clock 234) much more suitable for accurate testing of the phase noise of device under test 236.

As further shown in FIG. 2, optional reference clock generator 228 is configured to generate reference clock 230 using the system clock provided by system clock generator 222. Optional reference clock generator 228 can be, for example, a dedicated reference signal generator or a stand-alone function generator situated in tester 220. Reference clock 230 can be, for example, a time varying signal, such as a square wave or a sinusoidal wave. By way of example, the frequency of reference clock 230 can be, for example, approximately 20.0 MHz. Reference clock 230 typically has a phase noise that, although might be generally considered low, is referred to as a "high phase noise" for the purpose of the present application and to distinguish such phase noise from the much lower phase noise provided by low phase noise clock 234 according to the present invention, making it (i.e. low phase noise clock 234) much more suitable for accurate testing of the phase noise of device under test 236.

As shown in FIG. 2 and as discussed further below, crystal filter module 232 can be configured to receive either digital channel output 226 or reference clock 230 and to convert either digital channel output 226 or reference clock 230 to a low phase noise clock, such as low phase noise clock 234. In one embodiment, crystal filter module 232 (also referred to simply as a "crystal filter" in the present application) can include a monolithic crystal filter and an appropriate configuration of resistors and capacitors for achieving a proper termination impedance for crystal filter module 232. In another embodiment, crystal filter module 232 can include a discrete crystal filter. In one embodiment, crystal filter module 232 can be configured to have a center frequency which is approximately equal to the frequency of either reference clock 230 or digital channel output 226. By way of example, crystal filter module 232 can be configured to have a center frequency of approximately 20.0 MHz.

As shown in FIG. 2, crystal filter module 232 can be configured to provide low phase noise clock 234 to the crystal oscillator input ("XTL_IN") of device under test 236. In the embodiment shown in FIG. 2, crystal oscillator output ("XTL_OUT") 238 of device under test 236 is left floating. Device under test 236 can be, for example, a wireless chip such as a WLAN transceiver, a WiMAX transceiver, or a Bluetooth transceiver. It should be noted that tester 220 can be coupled to device under test 236 with a number of buses and probes during actual testing of device under test 236, which are not shown in FIG. 2 to preserve simplicity.

Figure 3:
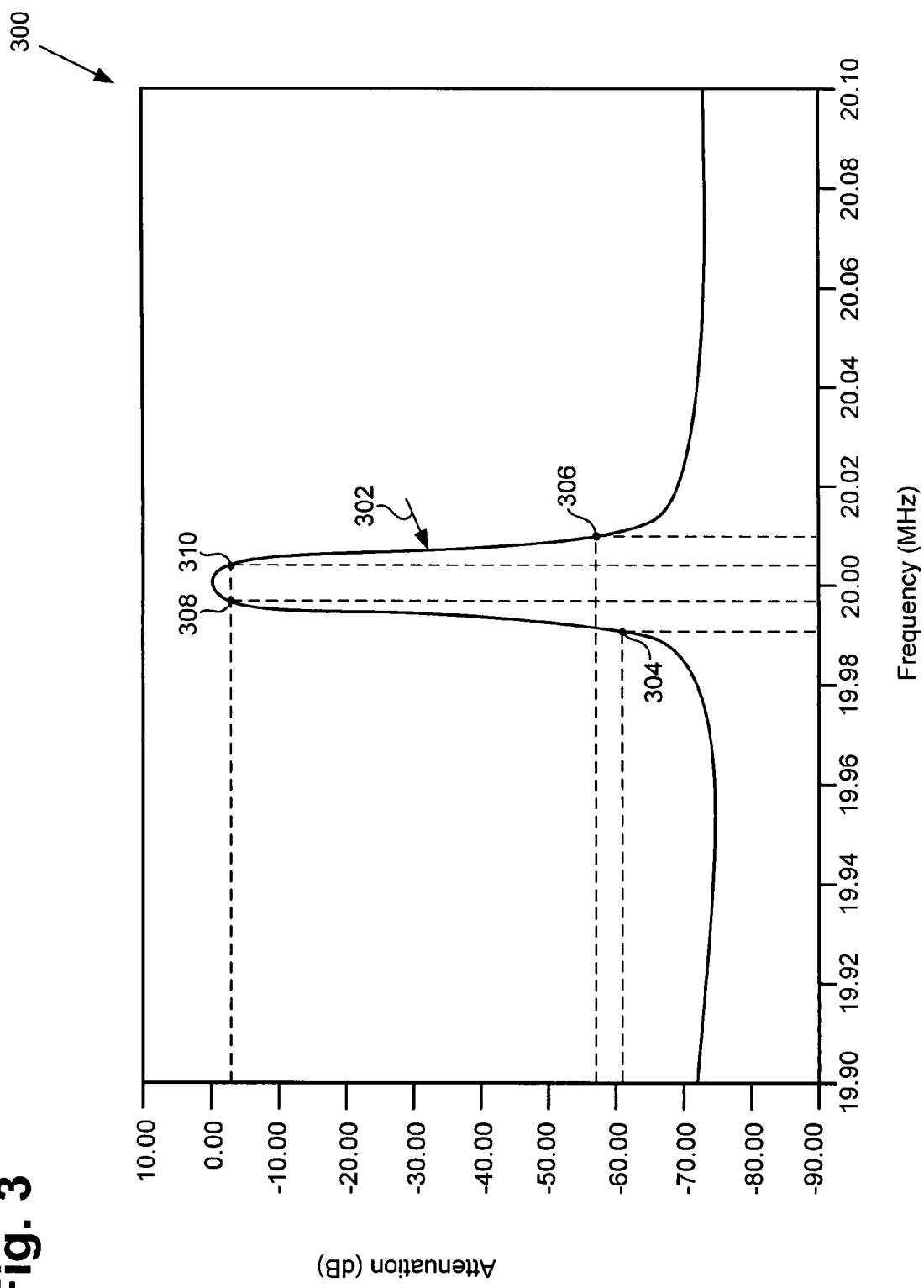
FIG. 3 shows an exemplary frequency response of a crystal filter module in accordance with one embodiment of the invention.

FIG. 3 shows an exemplary frequency response of crystal filter module 232 according to an embodiment where crystal filter module 232 has a center frequency of approximately 20.0 MHz. Plot 300 includes curve 302, which represents the frequency response of crystal filter module 232. In FIG. 3, the y-axis of plot 300 represents attenuation in decibels ("dB") and the x-axis represents the input frequency in Hertz ("Hz"). As shown in FIG. 3 and as discussed below, the narrow pass-band of crystal filter module 232 can enable crystal filter module 232 to pass a narrow frequency range from either digital channel output 226 or reference clock 230.

As shown in FIG. 3, the −3.0 dB pass-band of crystal filter module 232 is indicated by points 308 and 310 on curve 302. As shown in FIG. 3, point 308 on curve 302 corresponds to a frequency of approximately 19.997 MHz and an attenuation of −3.0 dB, and point 310 on curve 302 corresponds to a frequency of approximately 20.003 MHz and an attenuation of −3.0 dB. Thus, the −3.0 dB pass-band of crystal filter module 232 ranges between an offset of −3.0 kHz from the center frequency and an offset of 3.0 kHz from the center frequency. Moreover, as indicated by points 304 and 306 on curve 302, crystal filter module 232 can substantially attenuate frequencies at offsets of approximately −10.0 kHz and 10.0 kHz from the center frequency. For example, point 304 on curve 302 corresponds to a frequency of approximately 19.99 MHz and an attenuation of approximately −60.8 dB, while point 306 on curve 302 corresponds to a frequency of approximately 20.01 MHz and an attenuation of approximately −57.9 dB. In other embodiments, crystal filter module 232 can be configured to have a −3.0 dB pass-band ranging between an offset of approximately −200.0 Hz from the center frequency and an offset of approximately 200.0 Hz from the center frequency.

The narrow pass-band of crystal filter module 232 discussed above can substantially reduce the phase noise of a high phase noise digital signal, e.g., reference clock 230 or digital channel output 226, received by crystal filter module 232. Accordingly, crystal filter module 232 can be configured to pass a narrow frequency range from either reference clock 230 or digital channel output 226, thereby converting reference clock 230 or digital channel output 226 to a low phase noise clock, such as low phase noise clock 234.

Figure 4:
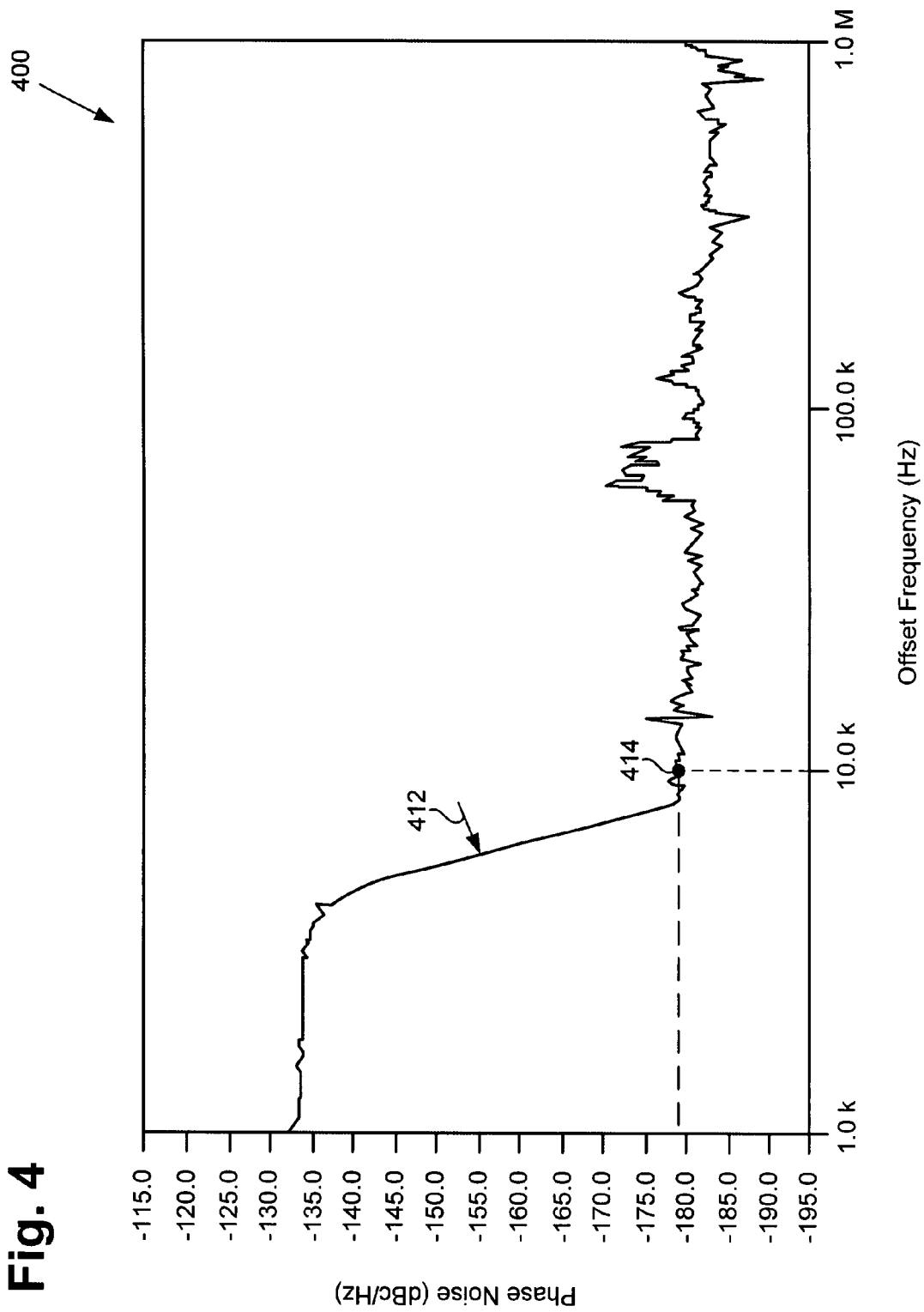
FIG. 4 shows the phase noise reduction by a crystal filter module in accordance with one embodiment of the invention.

FIG. 4 provides an example illustrating the phase noise reduction capability of crystal filter module 232. Plot 400 includes phase noise response 412, which represents the phase noise of an exemplary "high phase noise" output of reference clock generator 228 with a frequency of approximately 20.0 MHz after being filtered through crystal filter module 232. In FIG. 4, the y-axis of plot 400 represents phase noise in decibels relative to the carrier power per Hertz ("dBc/Hz") and the x-axis represents the carrier frequency offset (also referred to as "offset frequency") in Hertz ("Hz"). A high phase noise reference clock output having an exemplary phase noise within a range of approximately −130.0 dBc/Hz and −135.0 dBc/Hz at an offset of approximately 10.0 kHz, i.e., at a frequency of 20.01 MHz, can be received by crystal filter module 232 and, as shown by plot 400, converted to a low phase noise clock having a phase noise of approximately −178.0 dBc/Hz at an offset of approximately 10.0 kHz, as indicated by point 414 on phase noise response 412. It should be noted that crystal filter module 232 can actually reduce the phase noise of the reference clock output to as low as approximately −190.0 dBc/Hz at an offset of approximately 10.0 kHz, which is generally below the noise floor of typical test instruments.

Similar, but slightly lower, phase noise improvement is achieved when the phase noise of an exemplary "high phase noise" digital channel output 226 with a frequency of approximately 20.0 MHz is significantly reduced after being filtered through crystal filter module 232. Although not shown by a separate plot, similar to the results illustrated by plot 400, in one example, a high phase noise digital channel output having an exemplary phase noise within a range of approximately −120.0 dBc/Hz and −125.0 dBc/Hz at an offset of approximately 10.0 kHz, i.e., at a frequency of 20.01 MHz, can be received by crystal filter module 232 and converted to a low phase noise clock having a phase noise of approximately −172.0 dBc/Hz at an offset of approximately 10.0 kHz.

Therefore, the present invention enables tester 220 to drive the crystal oscillator input of device under test 236 using low phase noise clock 234, which has a phase noise as low as or lower than a phase noise of a clock generated by a crystal oscillator during normal operation of device under test 236. Furthermore, the invention causes coherency to be maintained between the system clock of tester 220 and low phase noise clock 234, without causing a slow down in the production test time due to, for example, digital signal processing that would otherwise be required to compensate for the lack of coherency. Thus, coherency is achieved and maintained, allowing the fastest possible production test times. As such, tester 220 can accurately test the phase noise of a high frequency electronic device, such as device under test 236.

Since crystal filter module 232 can receive a digital channel output from a digital sub-system typically included in a tester, the present invention can advantageously eliminate the need for costly dedicated reference signal generators or stand-alone function generators, such as optional reference clock generator 228. Thus, reference clock generator 228 can be considered as merely optional and is therefore shown by dashed lines in FIG. 2. However, the invention advantageously allows optional reference clock generator 228 to be used if already available in tester 220. Therefore, considering the low cost involved in implementing crystal filter module 232, the present invention significantly increases the accuracy of tester 220, while reducing the overall cost of tester 220.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a low phase noise testing system utilizing a crystal filter has been described.

The invention claimed is:

1. A low phase noise testing system comprising:
a tester providing a high phase noise digital channel output;
a crystal filter configured to receive said digital channel output and to pass a narrow frequency range from said digital channel output, whereby said high phase noise digital channel output is converted to a low phase noise clock for use by a device under test.

2. The system of claim 1 wherein said high phase noise digital channel output is generated by a digital sub-system in said tester.

3. The system of claim 1 wherein said crystal filter is a monolithic crystal filter.

4. The system of claim 1 wherein said crystal filter is a discrete crystal filter.

5. The system of claim 1 wherein said crystal filter has a pass-band ranging between an offset of approximately −3.0 kHz and 3.0 kHz from a center frequency of said crystal filter.

6. The system of claim 1 wherein said low phase noise clock has a phase noise less than approximately −172.0 dBc/Hz at an offset of approximately 10.0 kHz from a center frequency of said crystal filter.

7. The system of claim 1 wherein a system clock of said tester and said low phase noise clock are substantially coherent.

8. The system of claim 1 wherein said device under test is a wireless chip.

9. The system of claim 8 wherein said wireless chip is selected from the group consisting of a wireless local area network ("WLAN") transceiver, a Worldwide Interoperability for Microwave Access ("WiMAX") transceiver, and a Bluetooth transceiver.

10. A low phase noise testing system comprising:
a tester providing a high phase noise reference clock from a reference clock generator;
a crystal filter configured to receive said reference clock and to pass a narrow frequency range from said reference clock, whereby said high phase noise reference clock is converted to a low phase noise clock for use by a device under test.

11. The system of claim 10 wherein said reference clock generator uses a system clock of said tester to generate said reference clock.

12. The system of claim 10 wherein said crystal filter is a monolithic crystal filter.

13. The system of claim 10 wherein said crystal filter is a discrete crystal filter.

14. The system of claim 10 wherein said crystal filter has a pass-band ranging between an offset of approximately −3.0 kHz and 3.0 kHz from a center frequency of said crystal filter.

15. The system of claim 10 wherein said low phase noise clock has a phase noise less than approximately −178.0 dBc/Hz at an offset of approximately 10.0 kHz from a center frequency of said crystal filter.

16. The system of claim 10 wherein a system clock of said tester and said low phase noise clock are substantially coherent.

17. The system of claim 10 wherein said device under test is a wireless chip.

18. The system of claim 17 wherein said wireless chip is selected from the group consisting of a wireless local area network ("WLAN") transceiver, a Worldwide Interoperability for Microwave Access ("WiMAX") transceiver, and a Bluetooth transceiver.

* * * * *